(12) United States Patent
Imada

(10) Patent No.: US 8,941,116 B2
(45) Date of Patent: Jan. 27, 2015

(54) SEMICONDUCTOR DEVICE AND METHOD OF MANUFACTURING THE SAME

(75) Inventor: Tadahiro Imada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 448 days.

(21) Appl. No.: 13/208,779

(22) Filed: Aug. 12, 2011

(65) Prior Publication Data

US 2012/0104408 A1 May 3, 2012

(30) Foreign Application Priority Data

Nov. 2, 2010 (JP) ................................. 2010-246743

(51) Int. Cl.
*H01L 29/778* (2006.01)
*H01L 21/8252* (2006.01)
*H01L 27/06* (2006.01)
*H01L 29/10* (2006.01)
*H01L 29/66* (2006.01)
H01L 29/20 (2006.01)

(52) U.S. Cl.
CPC ........ *H01L 29/7787* (2013.01); *H01L 21/8252* (2013.01); *H01L 27/0605* (2013.01); *H01L 29/1029* (2013.01); *H01L 29/66462* (2013.01); H01L 29/2003 (2013.01)
USPC ....... 257/76; 257/194; 257/E29.246; 438/172

(58) Field of Classification Search
None
See application file for complete search history.

(56) References Cited

U.S. PATENT DOCUMENTS

| | | | |
|---|---|---|---|
| 6,424,426 B1 | 7/2002 | Henry | 358/1.15 |
| 2002/0191227 A1 | 12/2002 | Henry | 358/442 |
| 2003/0020959 A1 | 1/2003 | Henry | 358/402 |
| 2004/0201038 A1 | 10/2004 | Kimura et al. | |
| 2006/0232813 A1 | 10/2006 | Henry et al. | 358/1.15 |
| 2007/0002388 A1 | 1/2007 | Henry et al. | 358/400 |
| 2007/0008574 A1 | 1/2007 | Henry et al. | 358/1.15 |
| 2007/0024899 A1 | 2/2007 | Henry et al. | 358/1.15 |
| 2007/0026552 A1 | 2/2007 | Kimura et al. | |
| 2007/0168557 A1 | 7/2007 | Henry | 709/246 |
| 2007/0223051 A1 | 9/2007 | Henry et al. | 358/407 |
| 2007/0228422 A1 | 10/2007 | Suzuki et al. | 257/213 |
| 2007/0228477 A1 | 10/2007 | Suzuki et al. | 257/368 |
| 2007/0229889 A1 | 10/2007 | Henry et al. | 358/1.15 |

(Continued)

FOREIGN PATENT DOCUMENTS

| | | |
|---|---|---|
| JP | 62002646 A | 1/1987 |
| JP | 2004-228481 A | 8/2004 |

(Continued)

OTHER PUBLICATIONS

Notice of Preliminary Rejection issued in counterpart application No. 10-2011-87398 from the Korean Intellectual Property Office mailed Oct. 11, 2012 with English translation (9 pages).

(Continued)

*Primary Examiner* — Minh-Loan Tran
*Assistant Examiner* — Fazli Erdem
(74) *Attorney, Agent, or Firm* — Kratz, Quintos & Hanson, LLP

(57) ABSTRACT

In an aspect of a semiconductor device, there are provided a substrate, a transistor including an electron transit layer and an electron supply layer formed over the substrate, a nitride semiconductor layer formed over the substrate and connected to a gate of the transistor, and a controller controlling electric charges moving in the nitride semiconductor layer.

12 Claims, 12 Drawing Sheets

(56) References Cited

U.S. PATENT DOCUMENTS

| | | | |
|---|---|---|---|
| 2007/0229890 A1 | 10/2007 | Henry et al. | 358/1.15 |
| 2007/0236732 A1 | 10/2007 | Henry | 358/1.15 |
| 2007/0236749 A1 | 10/2007 | Henry et al. | 358/402 |
| 2007/0236750 A1 | 10/2007 | Henry et al. | 358/402 |
| 2007/0237314 A1 | 10/2007 | Henry et al. | 379/100.08 |
| 2008/0130040 A1 | 6/2008 | Henry et al. | 358/1.15 |
| 2008/0166173 A1 | 7/2008 | Gibbons | 401/131 |
| 2008/0212144 A1 | 9/2008 | Henry et al. | 358/407 |
| 2009/0034701 A1 | 2/2009 | Henry et al. | 379/100.01 |
| 2009/0059271 A1 | 3/2009 | Henry et al. | 358/1.15 |
| 2009/0059310 A1 | 3/2009 | Henry et al. | 358/403 |
| 2009/0159925 A1* | 6/2009 | Machida | 257/124 |
| 2009/0206363 A1* | 8/2009 | Machida et al. | 257/133 |
| 2010/0109015 A1 | 5/2010 | Ueno | |
| 2010/0155781 A1* | 6/2010 | Suzuki et al. | 257/195 |
| 2011/0062438 A1* | 3/2011 | Kaneko | 257/43 |
| 2011/0227132 A1* | 9/2011 | Anda et al. | 257/192 |
| 2011/0260777 A1 | 10/2011 | Suzuki et al. | 327/493 |

FOREIGN PATENT DOCUMENTS

| | | |
|---|---|---|
| JP | 2004-534380 A1 | 11/2004 |
| JP | 2008198675 A | 8/2008 |
| JP | 2010109322 A | 5/2010 |
| KR | 2007-0098494 | 10/2007 |

OTHER PUBLICATIONS

Taiwan Office Action issued for Taiwan Patent Application No. 100129763 dated Nov. 14, 2013.

Japanese Office Action of Japanese Patent Application 2010-246743 dated Sep. 30, 2014. Translation of the relevant part, p. 2, lines 3-25 and p. 3, lines 6-10 of the Office Action.

* cited by examiner

US 8,941,116 B2

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2010-246743, filed on Nov. 2, 2010, the entire contents of which are incorporated herein by reference.

FIELD

The embodiments discussed herein are directed to a semiconductor device and a method of manufacturing the same.

BACKGROUND

Conventionally, studies have been made about a high electron mobility transistor (HEMT), in which an AlGaN layer and a GaN layer are formed over a substrate by crystal growth and the GaN layer functions as an electron transit layer. The band gap of GaN is 3.4 eV, which is greater than the band gap of Si (1.1 eV) and the band gap of GaAs (1.4 eV). Therefore, the breakdown voltage of the GaN-based HEMT is high and is promising as a high breakdown voltage power device of an automobile or the like.

A HEMT is mainly mounted on a circuit board or the like, on which a gate driver is mounted, and used with connected to the gate driver. In other words, a voltage for ON/OFF control is supplied to the gate of the HEMT from the gate driver via the circuit and the like formed on the circuit board.

However, driving via the circuit and the like formed on the circuit board has a difficulty in operating the HEMT at a sufficiently high speed because of a large inductance component between the gate driver and the HEMT. Further, it is conventionally difficult to house the gate driver and the HEMT in one chip.

Patent Document 1: Japanese National Publication of International Patent Application No. 2004-534380

SUMMARY

In an aspect of a semiconductor device, there are provided a substrate, a transistor including an electron transit layer and an electron supply layer formed over the substrate, a nitride semiconductor layer formed over the substrate and connected to a gate of the transistor, and a controller controlling electric charges moving in the nitride semiconductor layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments will be explained with reference to accompanying drawings.

First Embodiment

Figure 1A:
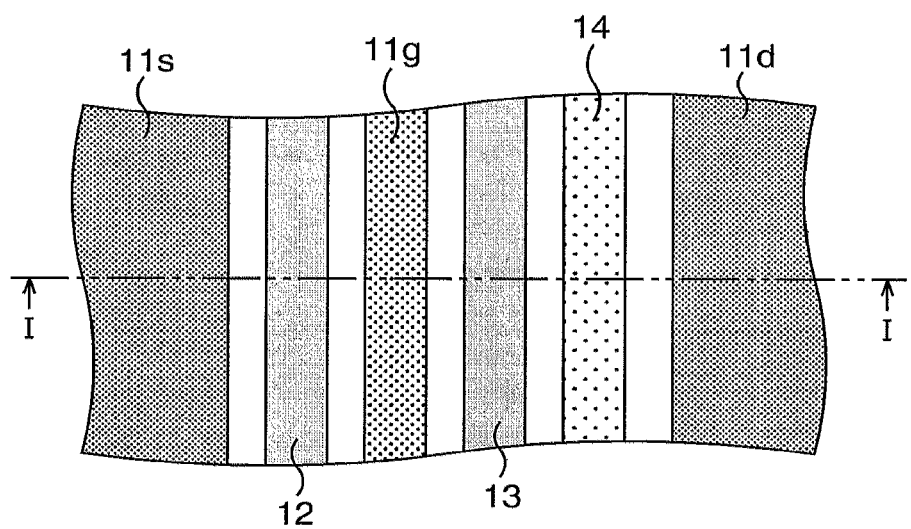
FIGS. 1A and 1B are views illustrating an internal structure of a semiconductor device according to a first embodiment.
Figure 1B:
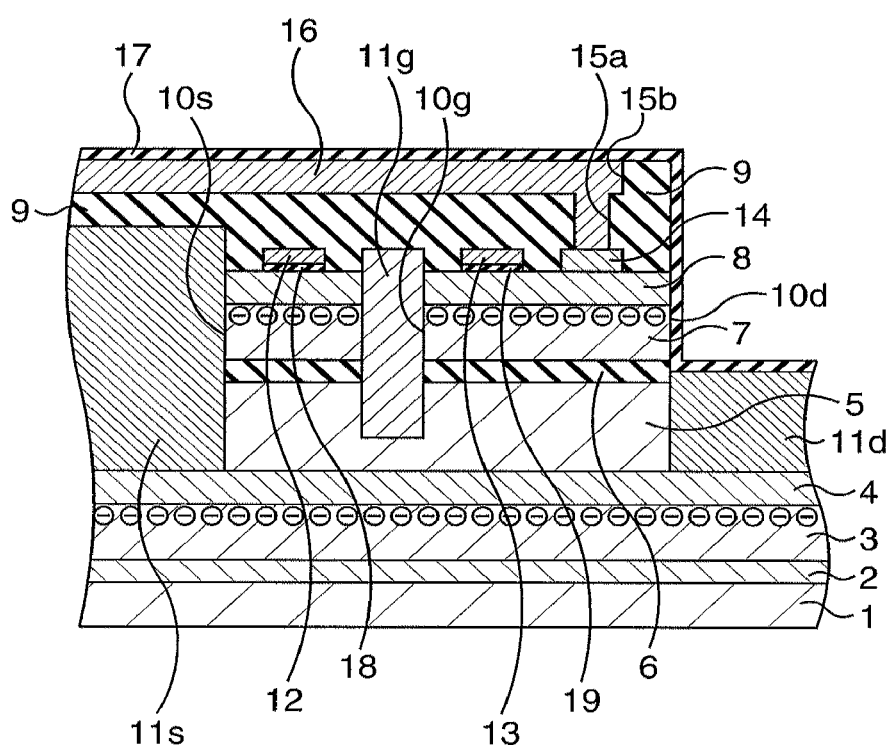

First, a semiconductor device according to a first embodiment will be described. FIG. 1A is a plan view illustrating a positional relation between electrodes and so on of the semiconductor device according to the first embodiment, and FIG. 1B is a cross-sectional view illustrating a structure of the semiconductor device according to the first embodiment. FIG. 1B illustrates a cross-section taken along a line I-I in FIG. 1A.

As illustrated in FIGS. 1A and 1B, in the first embodiment, a buffer layer 2, an electron transit layer 3, an electron supply layer 4, a cap layer 5, an insulating layer 6, an electron transit layer 7, and an electron supply layer 8 are formed in this order over a substrate 1. As the substrate 1, for example, an n-type Si substrate is used. As the buffer layer 2, for example, an AlN layer is formed, and its thickness is, for example, 1 nm to 1000 nm. As the electron transit layer 3, for example, an intrinsic GaN layer is formed, and its thickness is, for example, 10 nm to 5000 nm. As the electron supply layer 4, for example, an $Al_{0.25}Ga_{0.75}N$ layer is formed, and its thickness is, for example, 1 nm to 100 nm. As the cap layer 5, for example, an n-type GaN layer is formed, and its thickness is, for example, 1 nm to 100 nm. In the cap layer 5, for example, Si has been doped. As the insulating layer 6, for example, an AlN layer is formed, and its thickness is, for example, 10 nm to 5000 nm. As the insulating layer 6, an AlGaN layer, a p-type GaN layer, a Fe-doped GaN layer, a Si oxide layer, an Al oxide layer, a Si nitride layer or a carbon layer may be formed. Further, one or more of an AlN layer, an AlGaN layer, a p-type GaN layer, a Fe-doped GaN layer, a Si oxide layer, an Al oxide layer, a Si nitride layer and a carbon layer may be included in the insulating layer 6. As the electron transit layer 7, for example, an intrinsic GaN layer is formed, and its thickness is, for example, 10 nm to 5000 nm. As the electron supply layer 8, for example, an $Al_{0.25}Ga_{0.75}N$ layer is formed, and its thickness is, for example, 1 nm to 100 nm.

An opening 10g for a gate electrode intruding down to a portion of the cap layer 5 in the thickness direction is formed in the electron supply layer 8, the electron transit layer 7 and the insulating layer 6. Further, an opening 10s for a source electrode and an opening 10d for a drain electrode are formed in the electron supply layer 8, the electron transit layer 7, the insulating layer 6 and the cap layer 5 such that the opening 10g is located therebetween in plan view. Furthermore, a gate electrode 11g is formed in the opening 10g, a source electrode 11s is formed in the opening 10s, and a drain electrode 11d is formed in the opening 10d. For example, upper surfaces of the gate electrode 11g and the source electrode 11s are at levels above an upper surface of the electron supply layer 8, and an upper surface of the drain electrode 11d is at a level between an upper surface of the insulating layer 6 and an upper surface of the cap layer 5.

A signal line 12, a signal line 13, and a pad 14 are formed on the electron supply layer 8. An insulating film 18 is provided between the signal line 12 and the electron supply layer 8, and an insulating film 19 is provided between the signal line 13 and the electron supply layer 8. The signal line 12 is provided, in plan view, between the gate electrode 11g and the source electrode 11s so as to divide a region between the gate electrode 11g and the source electrode 11s into two regions. The signal line 13 is provided, in plan view, between the gate electrode 11g and the drain electrode 11d to divide a region between the gate electrode 11g and the drain electrode 11d into two regions. Further, the pad 14 is provided, in plan view, between the signal line 13 and the drain electrode 11d to divide a region between the signal line 13 and the drain electrode 11d into two regions. In other words, the signal line 13 is provided, in plan view, between the gate electrode 11g and the pad 14 to divide a region between the gate electrode 11g and the pad 14 into two regions.

An insulating layer 9 is formed which covers the gate electrode 11g, the source electrode 11s, the signal line 12, the signal line 13, and the pad 14. As the insulating layer 9, for example, a silicon nitride layer is formed, and its thickness is, for example, 0.1 nm to 5000 nm. In the insulating layer 9, a hole 15a reaching the pad 14 and a groove 15b led to the hole 15a are formed, and a power supply line 16 is embedded in the hole 15a and the groove 15b.

Figure 2:
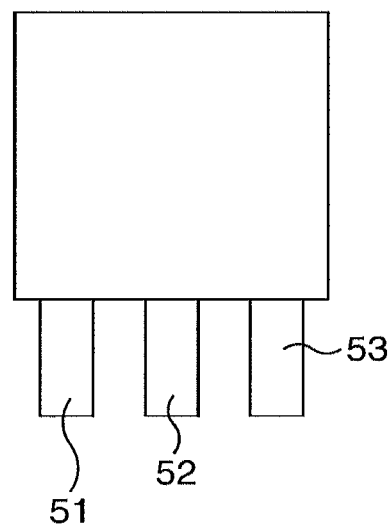
FIG. 2 is a view illustrating external terminals of the semiconductor device.

A passivation film 17 is formed which covers the insulating layer 9, the power supply line 16 and the drain electrode 11d. In the passivation film 17, an opening exposing a portion of the power supply line 16 and an opening exposing a portion of the drain electrode 11d are formed. In the passivation film 17 and the insulating layer 9, an opening exposing a portion of the source electrode 11s is formed. Through these openings, as illustrated in FIG. 2, the power supply line 16 is connected to an external terminal 51, the source electrode 11s is connected to an external terminal 52, and the drain electrode 11d is connected to an external terminal 53. Further, the signal lines 12 and 13 are connected to a gate driver provided on the substrate 1. For example, the gate driver is also covered with the passivation film 17.

The semiconductor device thus configured includes a GaN-based HEMT provided with the gate electrode 11g, the source electrode 11s, and the drain electrode 11d. In addition, for example, the source electrode 11s is grounded via the external terminal 52, the power supply line 16 is connected to a power supply of 12V via the external terminal 51, and the drain electrode 11d is supplied with a predetermined voltage according to the usage of the HEMT via the external terminal 53. Further, the gate driver applies a voltage of 0V or 12V to the signal line 12 and a voltage of 24V or 0V to the signal line 13. Accordingly, a voltage according to the voltage applied to the signal line 12 and the voltage applied to the signal line 13 is applied to the gate electrode 11g so that ON/OFF of the HEMT is switched according to the voltage. In short, switching between ON and OFF of the HEMT is performed by voltage control listed in the following Table 1.

TABLE 1

| ON/OFF of HEMT | SIGNAL LINE 12 | SIGNAL LINE 13 | GATE ELECTRODE 11g |
|---|---|---|---|
| ON | 0 V (OFF) | 24 V (ON) | 12 V (ON VOLTAGE) |
| OFF | 12 V (ON) | 0 V (OFF) | 0 V (OFF VOLTAGE) |

As listed in Table 1, at the timing when an ON voltage is applied to the signal line 12, an OFF voltage is applied to the signal line 13, whereas at the timing when an OFF voltage is applied to the signal line 12, an ON voltage is applied to the signal line 13. At the voltage control, the voltages are applied to the signal lines 12 and 13 from the gate driver provided on the substrate 1 so that electrons move in the electron transit layer 7 of a GaN-based material at a high speed. Accordingly, the HEMT can operate at a higher speed as compared to the case where the gate voltage of the HEMT is applied using a Si-based transistor.

Next, a method of manufacturing the semiconductor device according to the first embodiment will be described. FIG. 3A to FIG. 3F are cross-sectional views illustrating the method of manufacturing the semiconductor device according to the first embodiment in the order of steps.

Figure 3A:
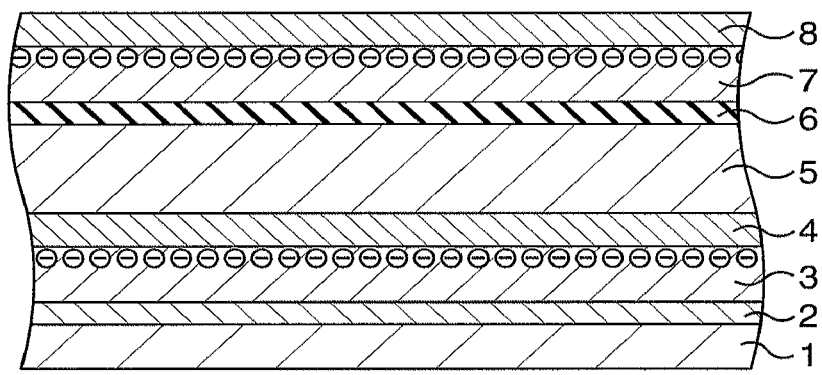
FIG. 3A to FIG. 3F are cross-sectional views illustrating a method of manufacturing the semiconductor device according to the first embodiment in the order of steps.

First, as illustrated in FIG. 3A, the buffer layer 2, the electron transit layer 3, the electron supply layer 4, the cap layer 5, the insulating layer 6, the electron transit layer 7, and the electron supply layer 8 are formed over the substrate 1 by, for example, the metal organic chemical vapor deposition (MOCVD) method.

Figure 4:
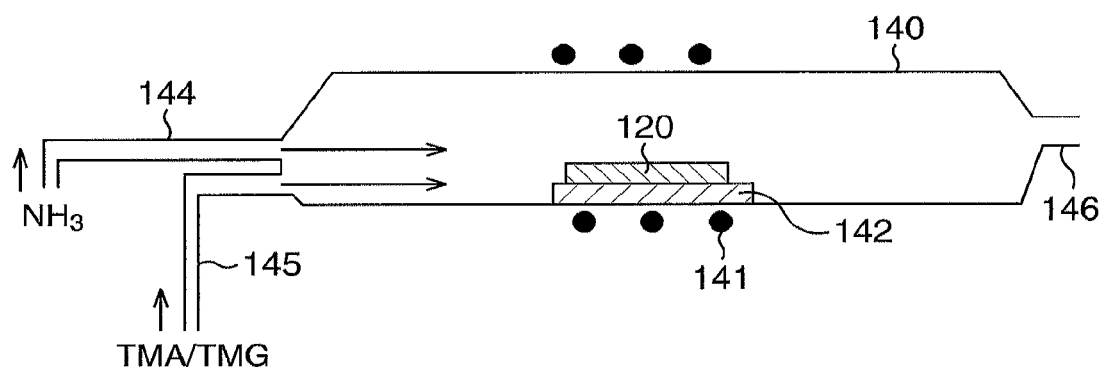
FIG. 4 is a diagram illustrating a structure of a MOCVD apparatus.

An MOCVD apparatus will be described here. FIG. 4 is a diagram illustrating a structure of a MOCVD apparatus. A high-frequency coil 141 is disposed around a reaction tube 140 made of quartz, and a carbon susceptor 142 for mounting a substrate 120 thereon is disposed inside the reaction tube 140. Two gas introduction pipes 144 and 145 are connected to an upstream end of the reaction tube 140 (an end portion on the left side in FIG. 4) so that compound source gases are supplied thereto. For example, an $NH_3$ gas is introduced as a nitrogen source gas from the gas introduction pipe 144, and an organic group III compound material such as trimethylaluminum (TMA), trimethylgallium (TMG) or the like is introduced from the gas introduction pipe 145 as a source gas of a group III element. Crystal growth takes place on the substrate 120, and excessive gasses are exhausted from a gas exhaust pipe 146 to a scrubber tower. Note that when the crystal growth by the MOCVD method is performed in a reduced pressure atmosphere, the gas exhaust pipe 146 is connected to a vacuum pump and an exhaust port of the vacuum pump is connected to the scrubber tower.

Conditions when an AlN layer is formed as the buffer layer 2 are set, for example, as follows:
flow rate of trimethylaluminum (TMA): 1 to 50 sccm;
flow rate of ammonia ($NH_3$): 10 to 5000 sccm;
pressure: 100 Torr; and
temperature: 1100° C.

Conditions when an intrinsic GaN layer is formed as the electron transit layer 3 are set, for example, as follows:
flow rate of trimethylgallium (TMG): 1 to 50 sccm;
flow rate of ammonia ($NH_3$): 10 to 10000 sccm;
pressure: 100 Torr; and
temperature: 1100° C.

Conditions when an $Al_{0.25}Ga_{0.75}N$ layer is formed as the electron supply layer 4 are set, for example, as follows:
flow rate of trimethylgallium (TMG): 0 to 50 sccm;
flow rate of trimethylaluminum (TMA): 0 to 50 sccm;
flow rate of ammonia ($NH_3$): 20 slm;
pressure: 100 Torr; and
temperature: 1100° C.

Conditions when an n-type GaN layer is formed as the cap layer 5 are set, for example, as follows:
flow rate of trimethylgallium (TMG): 1 to 50 sccm;
flow rate of ammonia ($NH_3$): 10 to 10000 sccm;
n-type impurity: silane ($SiH_4$);
pressure: 100 Torr; and
temperature: 1100° C.

Conditions when an AlN layer is formed as the insulating layer 6 are set, for example, as follows:

flow rate of trimethylaluminum (TMA): 1 to 50 sccm;
flow rate of ammonia ($NH_3$): 10 to 5000 sccm;
pressure: 100 Torr; and
temperature: 1100° C.

Conditions when an intrinsic GaN layer is formed as the electron transit layer 7 are set, for example, as follows:

flow rate of trimethylgallium (TMG): 1 to 50 sccm;
flow rate of ammonia ($NH_3$): 10 to 10000 sccm;
pressure: 100 Torr; and
temperature: 1100° C.

Conditions when an $Al_{0.25}Ga_{0.75}N$ layer is formed as the electron supply layer 8 are set, for example, as follows:

flow rate of trimethylgallium (TMG): 0 to 50 sccm;
flow rate of trimethylaluminum (TMA): 0 to 50 sccm;
flow rate of ammonia ($NH_3$): 20 slm;
pressure: 100 Torr; and
temperature: 1100° C.

Figure 3B:
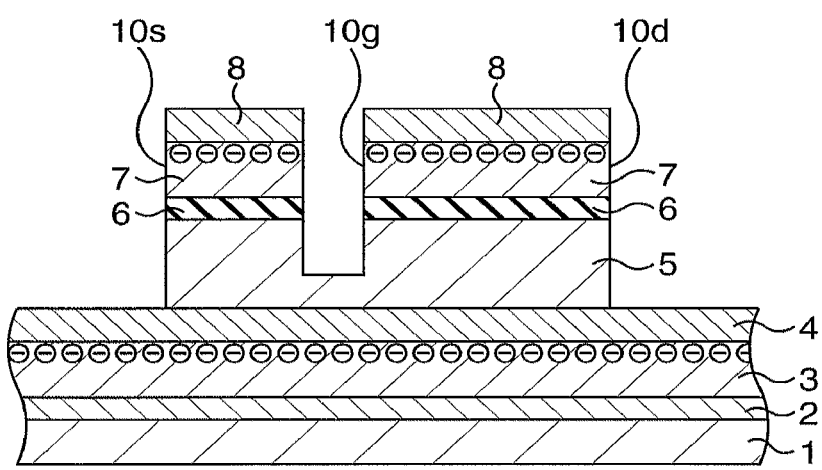

Subsequently, as illustrated in FIG. 3B, the opening 10g for the gate electrode, the opening 10s for the source electrode, and the opening 10d for the drain electrode are formed. It is preferable to concurrently form the openings 10s and the 10d, whereas it is preferable to form the opening 10g separately from the openings 10s and 10d. This is because the opening 10g is different in depth from the openings 10s and 10d. For the formation of the opening 10g, for example, a resist pattern may be formed which exposes a planned region where the opening 10g is to be formed, and portions of the electron supply layer 8, the electron transit layer 7, the insulating layer 6, and the cap layer 5 may be etched using the resist pattern as a mask. Thereafter, the resist pattern may be removed. For the formation of the openings 10s and 10d, for example, a resist pattern may be formed which exposes planned regions where the openings 10s and 10d are to be formed, and portions of the electron supply layer 8, the electron transit layer 7, the insulating layer 6, and the cap layer 5 may be etched using the resist pattern as a mask. Thereafter, the resist pattern may be removed.

Figure 3C:
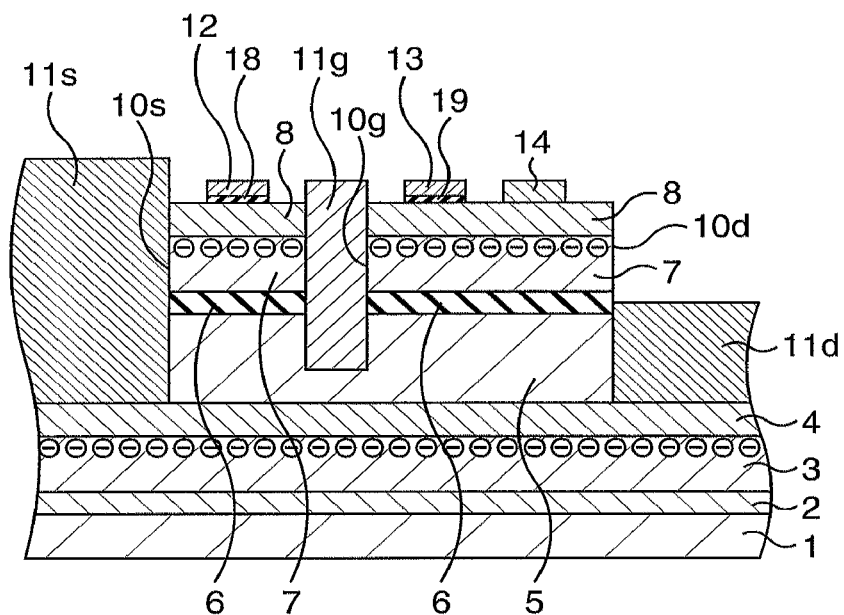

Then, as illustrated in FIG. 3C, the gate electrode 11g is formed, the source electrode 11s and the drain electrode 11d are formed, the insulating film 18, the insulating film 19, the signal line 12 and the signal line 13 are formed, and the pad 14 is formed. The order of forming them is not particularly limited. They may be formed, for example, a lift-off method.

Figure 3D:
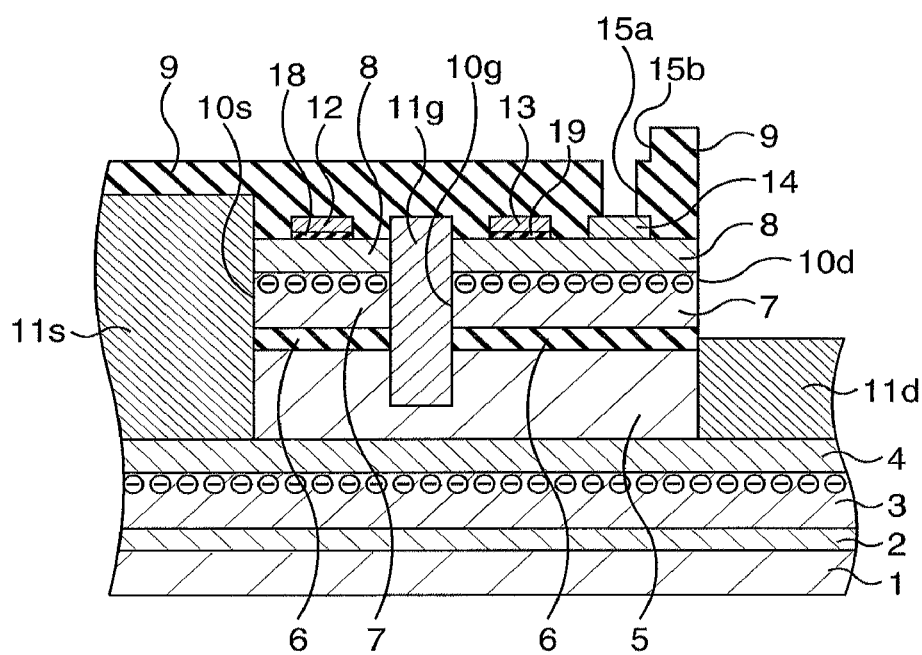

Subsequently, as illustrated in FIG. 3D, the insulating layer 9 is formed on the entire surface, and the groove 15b and the hole 15a are formed in the insulating layer 9. Further, the drain electrode 11d is exposed. The insulating layer 9 is formed by, for example, a plasma CVD method. Further, for the formation of the groove 15b and the hole 15a and the exposure of the drain electrode 11d, for example, selective etching using an $SF_6$ gas as an etching gas is performed using a resist pattern.

Figure 3E:
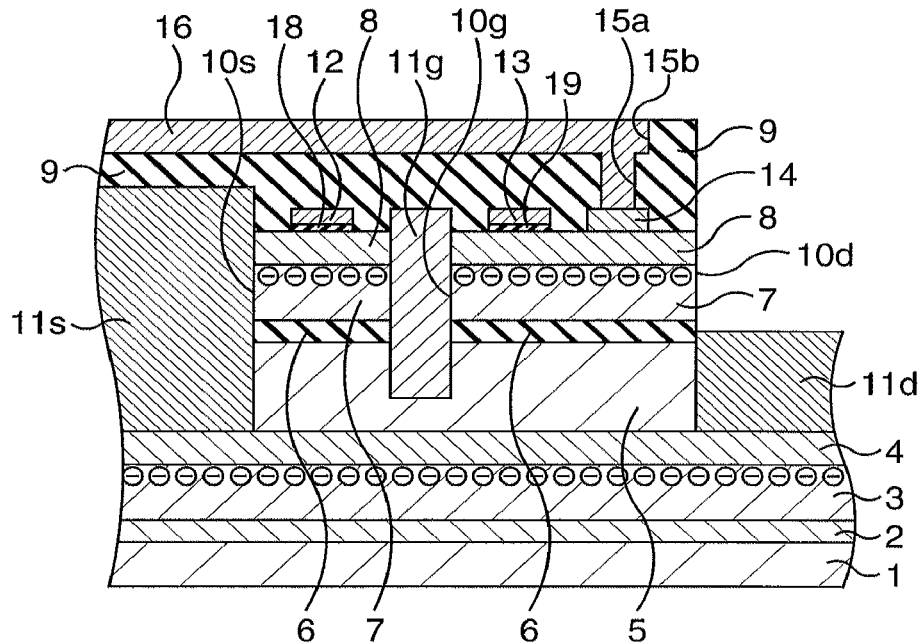

Subsequently, as illustrated in FIG. 3E, the power supply line 16 is formed in the groove 15b and the hole 15a. The power supply line 16 may be formed by, for example, the lift-off method.

Figure 3F:
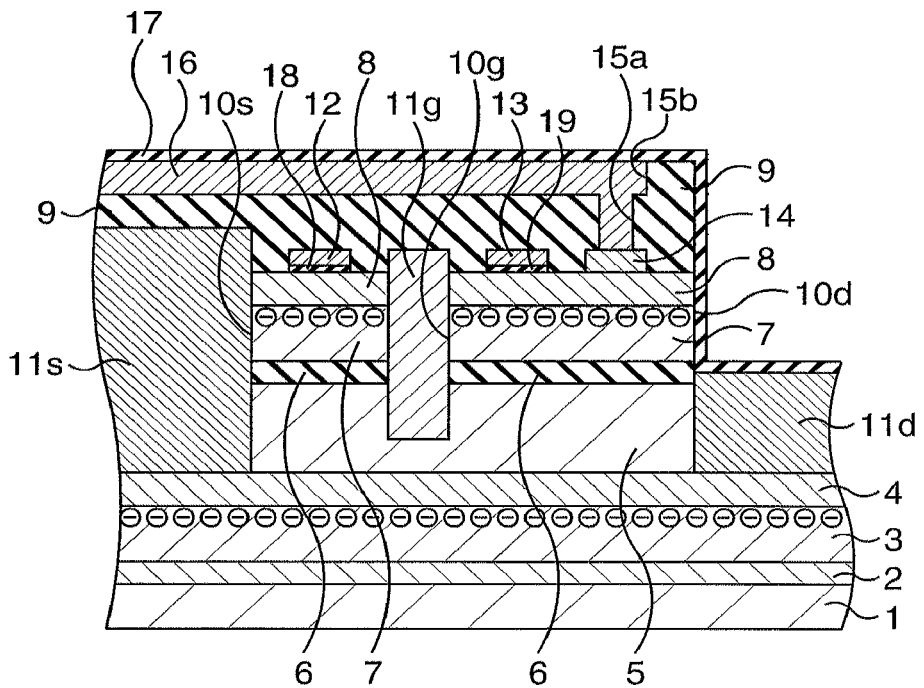

Then, as illustrated in FIG. 3F, the passivation film 17 covering the entire surface is formed, and the opening exposing a portion of the power supply line 16 and the opening exposing a portion of the drain electrode 11d are formed in the passivation film 17. Further, the opening exposing a portion of the source electrode 11s is formed in the passivation film 17 and the insulating layer 9.

In this manner, the semiconductor device may be completed. As necessary, the rear surface of the substrate 1 may be polished to adjust the thickness of the semiconductor device.

Note that materials of the gate electrode 11g, the source electrode 11s, the drain electrode 11d, the signal line 12, the signal line 13 and the pad 14 are not particularly limited. The materials of the signal line 12 and the signal line 13 may include, for example, polycrystalline silicon, Ni, Cr, Ti, Al and the like. Further, a stack of films of those materials may be used. The materials of the gate electrode 11g, the source electrode 11s, the drain electrode 11d, and the pad 14 may include, for example, Al, Ta and the like. Further, a stack of a Ta film and an Al film formed thereon may be used as the gate electrode 11g, the source electrode 11s, the drain electrode 11d, and the pad 14.

Second Embodiment

Figure 5A:
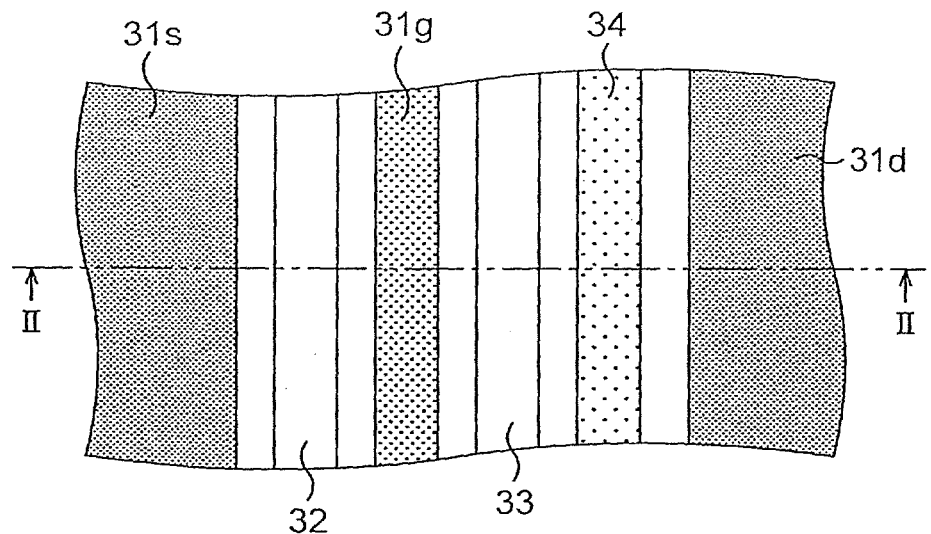
FIGS. 5A and 5B are views illustrating an internal structure of a semiconductor device according to a second embodiment.
Figure 5B:
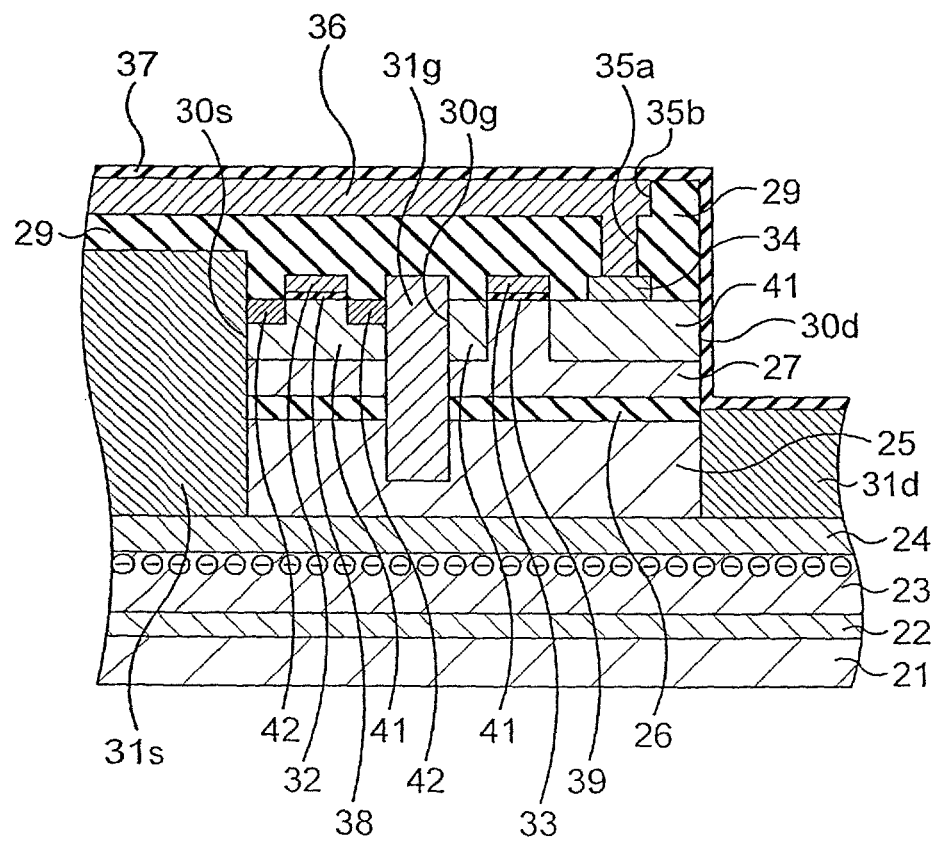

Next, a second embodiment will be described. FIG. 5A is a plan view illustrating a positional relation between electrodes and so on of a semiconductor device according to the second embodiment, and FIG. 5B is a cross-sectional view illustrating a structure of the semiconductor device according to the second embodiment. FIG. 5B illustrates a cross-section taken along a line II-II in FIG. 5A.

As illustrated in FIGS. 5A and 5B, in the second embodiment, a buffer layer 22, an electron transit layer 23, an electron supply layer 24, a cap layer 25, an insulating layer 26, and an n-type GaN layer 27 are formed in this order over a substrate 21. Materials used for the substrate 21, the buffer layer 22, the electron transit layer 23, the electron supply layer 24, the cap layer 25, and the insulating layer 26 are similar to those for the substrate 1, the buffer layer 2, the electron transit layer 3, the electron supply layer 4, the cap layer 5, and the insulating layer 6 respectively. The thickness of the n-type GaN layer 27 is, for example, 10 nm to 5000 nm.

An opening 30g for a gate electrode intruding down to a portion of the cap layer 25 in the thickness direction is formed in the n-type GaN layer 27 and the insulating layer 26. Further, an opening 30s for a source electrode and an opening 30d for a drain electrode are formed in the n-type GaN layer 27, the insulating layer 26 and the cap layer 25 such that the opening 30g is located therebetween in plan view. Furthermore, a gate electrode 31g is formed in the opening 30g, a source electrode 31s is formed in the opening 30s, and a drain electrode 31d is formed in the opening 30d. For example, upper surfaces of the gate electrode 31g and the source electrode 31s are at levels above an upper surface of the n-type GaN layer 27, and an upper surface of the drain electrode 31d is at a level between an upper surface of the insulating layer 26 and an upper surface of the cap layer 25.

On the side closer to the drain electrode 31d than the gate electrode 31g, a signal line 33 dividing a region between the gate electrode 31g and the drain electrode 31d into two regions is formed on the n-type GaN layer 27 via an insulating film 39. In addition, a p-type impurity is doped into surface layer portions of the n-type GaN layer 27 to form p-type GaN layers 41 in regions between the signal line 33 and the gate electrode 31g and between the signal line 33 and the drain electrode 31d in plan view. Further, on the side closer to the drain electrode 31d than the signal line 33, a pad 34 dividing a region between the signal line 33 and the drain electrode 31d into two regions is formed on the p-type GaN layer 41.

On the side closer to the source electrode 31g than the gate electrode 31g, the p-type impurity is doped into a surface layer portion of the p-type GaN layer 27 to form a p-type GaN layer 41. Further, a signal line 32 dividing a region between the gate electrode 31g and the source electrode 31s into two regions is formed on the p-type GaN layer 41 via an insulating film 38. In addition, an n-type impurity is doped into surface layer portions of the p-type GaN layer 41 to form n-type GaN layers 42 in regions between the signal line 32 and the gate electrode 31g and between the signal line 32 and the source electrode 31s in plan view.

An insulating layer 29 is formed which covers the gate electrode 31g, the source electrode 31s, the signal line 32, the signal line 33, and the pad 34. As the insulating layer 29, a layer similar to the insulating layer 9 is used. In the insulating layer 29, a hole 35a reaching the pad 34 and a groove 35b led to the hole 35a are formed, and a power supply line 36 is embedded in the hole 35a and the groove 35b.

A passivation film 37 is formed which covers the insulating layer 29, the power supply line 36 and the drain electrode 31d. In the passivation film 37, an opening exposing a portion of the power supply line 36 and an opening exposing a portion of the drain electrode 31d are formed. In the passivation film 37 and the insulating layer 29, an opening exposing a portion of the source electrode 31s is formed. Through these openings, the power supply line 36 is connected to an external terminal 51, the source electrode 31s is connected to an external terminal 52, and the drain electrode 31d is connected to an external terminal 53 as in the first embodiment. Further, the signal lines 32 and 33 are connected to a gate driver provided on the substrate 21. For example, the gate driver is also covered with the passivation film 37.

The semiconductor device thus configured includes a GaN-based HEMT provided with the gate electrode 31g, the source electrode 31s, and the drain electrode 31d. In addition, for example, the source electrode 31s is grounded via the external terminal 52, the power supply line 36 is connected to a power supply of 12V via the external terminal 51, and the drain electrode 31d is supplied with a predetermined voltage according to the usage of the HEMT via the external terminal 53. Further, the gate driver applies a voltage of 0V or 12V to the signal line 32 and a voltage of 24V or 0V to the signal line 33. Accordingly, a voltage according to the voltage applied to the signal line 32 and the voltage applied to the signal line 33 is applied to the gate electrode 31g so that ON/OFF of the HEMT is switched according to the voltage. In short, switching between ON and OFF of the HEMT is performed by voltage control listed in the Table 1 as in the first embodiment. For the voltage control, the gate driver provided on the substrate 21 applies the voltages to the signal lines 32 and 33 so that electric charges move at a high speed in the n-type GaN layer 27 or the p-type GaN layer 41. Accordingly, the HEMT can operate at a higher speed as compared to the case where the gate voltage of the HEMT is applied using a Si-based transistor.

Next, a method of manufacturing the semiconductor device according to the second embodiment will be described. FIG. 6A to FIG. 6F are cross-sectional views illustrating the method of manufacturing the semiconductor device according to the second embodiment in the order of steps.

Figure 6A:
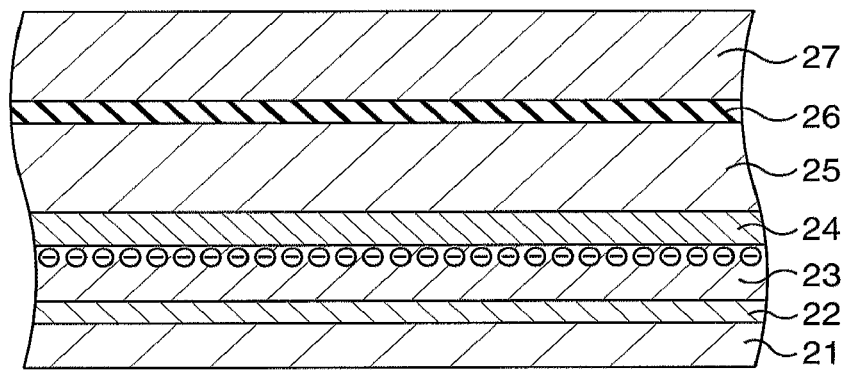
FIG. 6A to FIG. 6F are cross-sectional views illustrating a method of manufacturing the semiconductor device according to the second embodiment in the order of steps.

First, as illustrated in FIG. 6A, the buffer layer 22, the electron transit layer 23, the electron supply layer 24, the cap layer 25, the insulating layer 26, and the n-type GaN layer 27 are formed in this order over the substrate 21 by, for example, the MOCVD method.

Conditions when the buffer layer 22, the electron transit layer 23, the electron supply layer 24, the cap layer 25, and the insulating layer 26 are formed are the same as the conditions when forming the buffer layer 2, the electron transit layer 3, the electron supply layer 4, the cap layer 5, and the insulating layer 6. Conditions when the n-type GaN layer 27 is formed are set, for example, as follows:

flow rate of trimethylgallium (TMG): 1 to 50 sccm;
flow rate of ammonia ($NH_3$): 10 to 10000 sccm;
n-type impurity: silane ($SiH_4$);
pressure: 100 Torr; and
temperature: 1100° C.

Figure 6B:
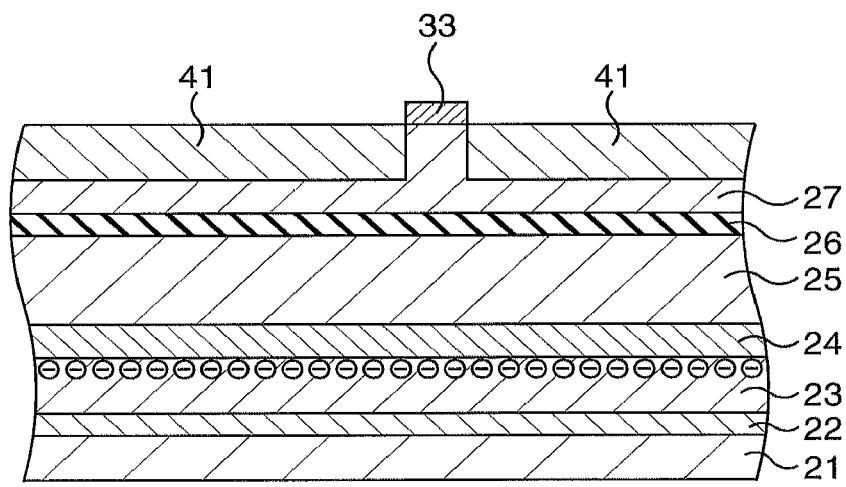

Then, as illustrated in FIG. 6B, the signal line 33 is formed on the n-type GaN layer 27. The signal line 33 is formed by, for example, the lift-off method. Thereafter, a p-type impurity (for example, Mg) is doped into the n-type GaN layer 27 using the signal line 33 as a mask to thereby form the p-type GaN layers 41 in the surface of the N-type GaN layer 27.

Figure 6C:
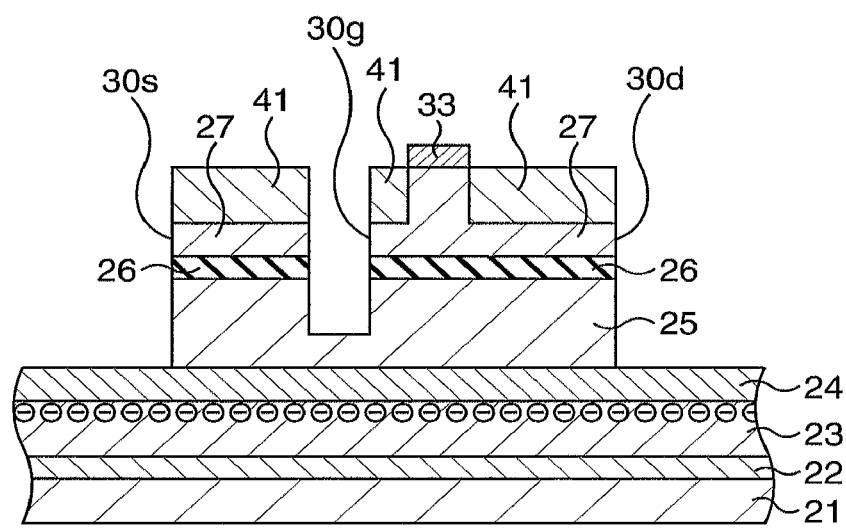

Subsequently, as illustrated in FIG. 6C, the opening 30g for the gate electrode, the opening 30s for the source electrode, and the opening 30d for the drain electrode are formed. The opening 30g, the opening 30s, and the opening 30d may be formed similarly to the opening 10g, the opening 10s, and the opening 10d.

Figure 6D:
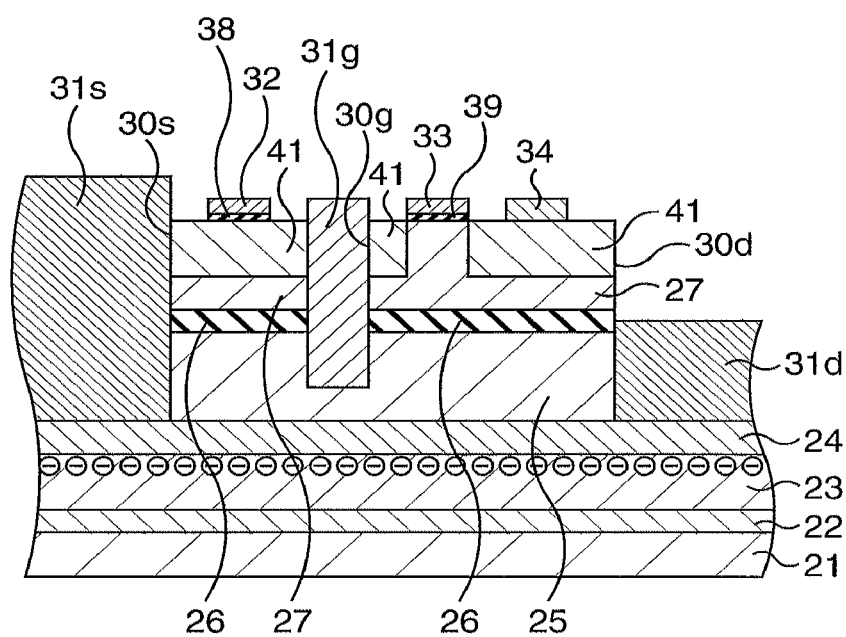

Then, as illustrated in FIG. 6D, the gate electrode 31g is formed, the source electrode 31s and the drain electrode 31d are formed, the signal line 32 is formed, and the pad 34 is formed. The order of forming them is not particularly limited. They may be formed by, for example, the lift-off method.

Figure 6E:
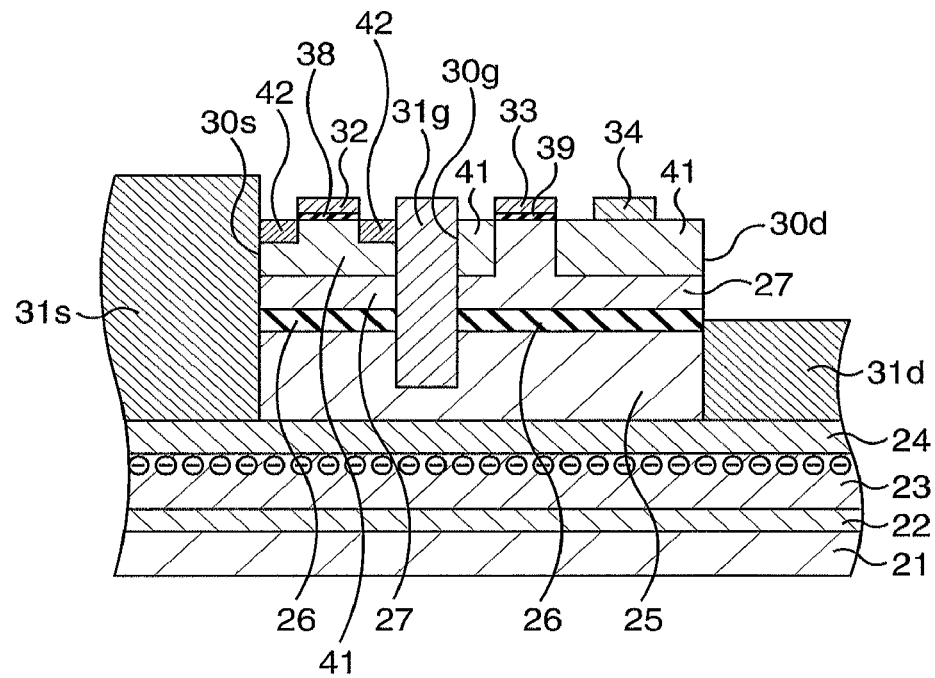

Thereafter, as illustrated in FIG. 6E, an n-type impurity (for example, Si) is doped into the p-type GaN layer 41 in the region between the gate electrode 31g and the source electrode 31s using the signal line 32 as a mask to thereby form n-type GaN layers 42 in the surfaces of the p-type GaN layers 41. In this event, the region between the gate electrode 31g and the drain electrode 31d is covered with a resist patter or the like.

Figure 6F:
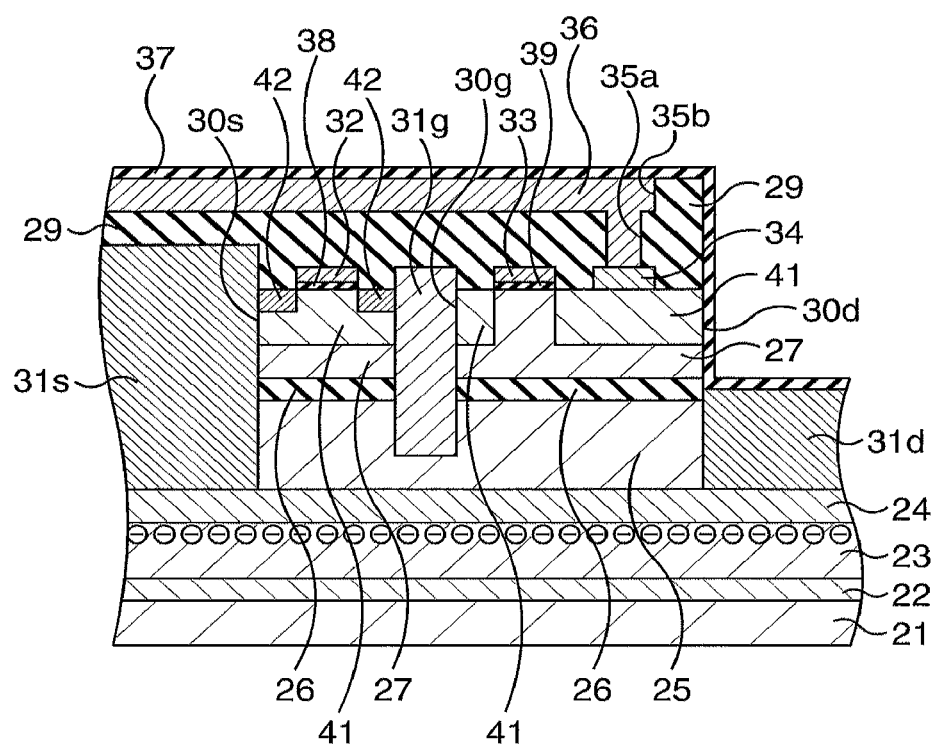

Then, as illustrated in FIG. 6F, formation of the insulating layer 29, formation of the groove 35b and the hole 35a, formation of the power supply line 36, and formation of the passivation film 37 and so on are performed. These treatments may be performed as in the first embodiment.

In this manner, the semiconductor device may be completed.

Figure 7:
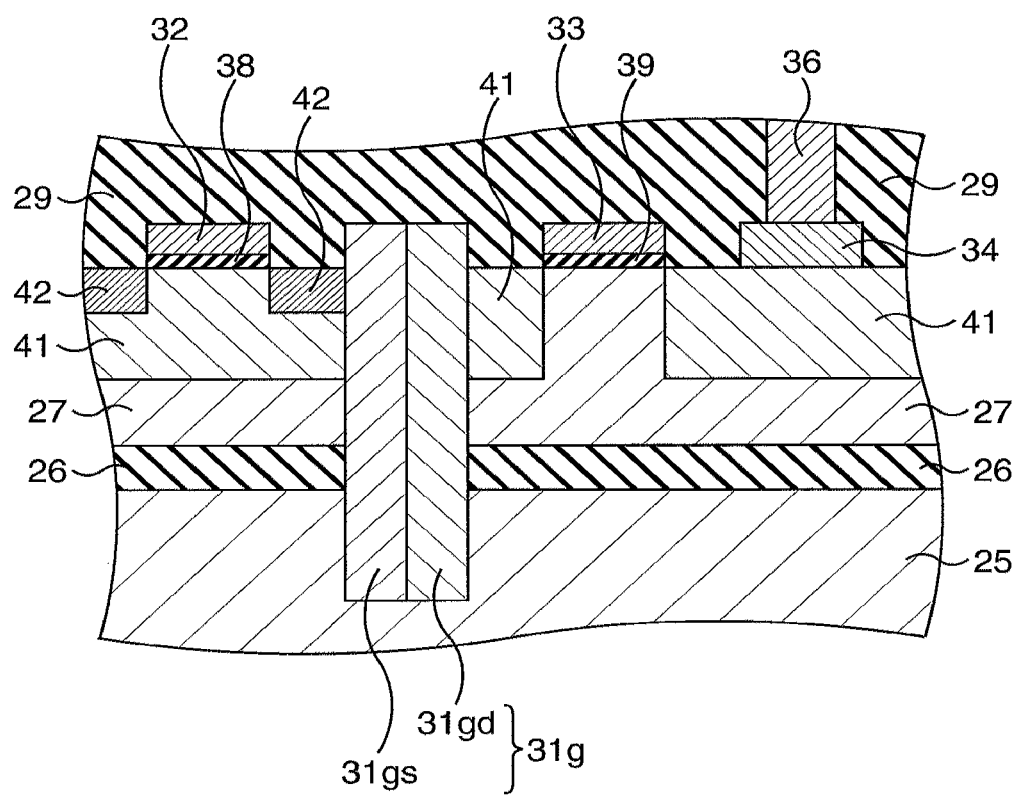
FIG. 7 is a cross-sectional view illustrating a preferred aspect of the second embodiment.

Note that it is preferable in the second embodiment that, as the gate electrode 31g, a gate electrode is used which includes a source-side part 31gs located on the source electrode 31s side and a drain-side part 31gd located on the drain electrode 31d side in plan view as illustrated in FIG. 7. This is to make it possible to select the material of the gate electrode 31g according to the kind of junctions such as an npn-junction existing between the gate electrode 31g and the source electrode 31s and a pnp-junction existing between the gate electrode 31g and the drain electrode 31d.

The materials of the gate electrode 31g, the source electrode 31s, the drain electrode 31d, the signal line 32, the signal line 33 and the pad 34 are not particularly limited. The materials of the signal line 32 may include, for example, polycrystalline silicon, Ni, Cr, Ti, Al and so on. Further, a stack of films of those materials may be used. The materials of the signal line 33 may include, for example, polycrystalline silicon, Ni, TiAlN and so on. Further, a stack of films of those materials may be used. The materials of the source-side part 31gs of the gate electrode 31g may include, for example, Al, Ta and so on. Further, as the source-side part 31gs, a stack of films of a Ta film and an Al film formed thereon may be used. The materials of the drain-side part 31gd of the gate electrode 31g may include, for example, Pd, Au and so on. Further, as the drain-side part 31gd, a stack of a Pd film and a Au film formed thereon may be used. The materials of the pad 34 may include, for example, Pd, Au and so on. Further, as the pad 34, a stack of a Pd film and a Au film formed thereon may be used. The materials of the source electrode 31s and the drain electrode 31d may include, for example, Al, Ta and the like. Further, a stack of a Ta film and an Al film formed thereon may be used as the source electrode 31s and the drain electrode 31d.

Third Embodiment

Figure 8A:
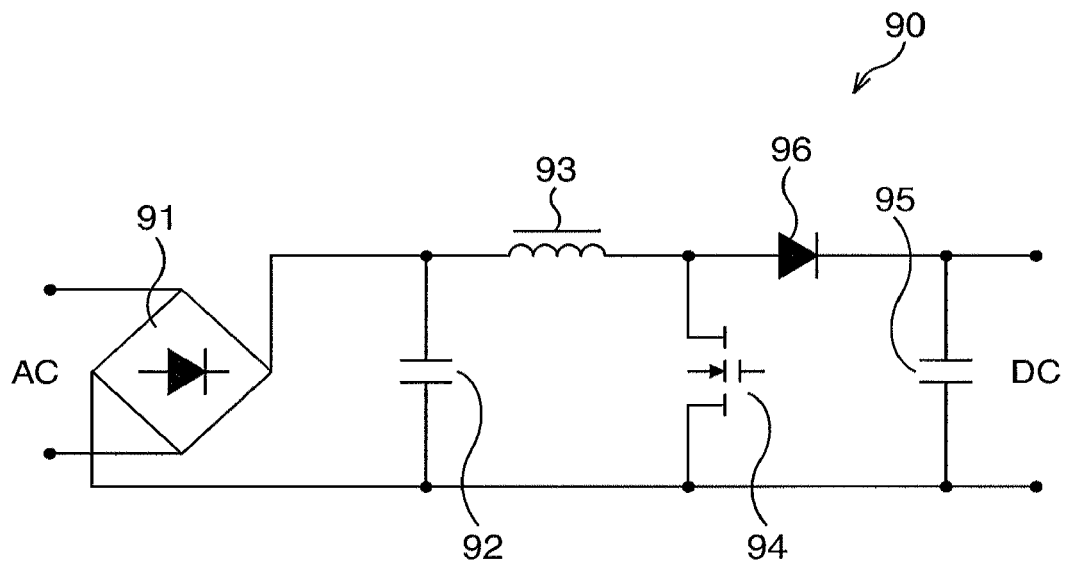
FIGS. 8A and 8B are diagrams illustrating a power supply apparatus according to a third embodiment.

Next, a third embodiment will be described. The third embodiment is an apparatus such as a server power supply or the like equipped with the semiconductor device according to the first or second embodiment. FIG. 8A is a diagram illustrating a power factor correction (PFC) circuit, and FIG. 8B is a view illustrating a server power supply including the PFC circuit illustrated in FIG. 8A.

As illustrated in FIG. 8A, a capacitor 92 connected to a diode bridge 91 to which an alternating-current power supply (AC) is connected is provided in the PFC circuit. One terminal of a choke coil 93 is connected to one terminal of the capacitor 92, and the other terminal of the choke coil 93 is connected with one terminal of a switch element 94 and the anode of a diode 96. The switch element 94 corresponds to the HEMT in the first or second embodiment, and the one terminal corresponds to the drain electrode 11d or 31d in the first or second embodiment. The other terminal of the switch element 94 corresponds to the source electrode 11s or 31s in the first or second embodiment. ON/OFF of the switch element 94 is controlled by the gate driver provided on the substrate 1 or 21. One terminal of a capacitor 95 is connected to the cathode of the diode 96. The other terminal of the capacitor 92, the other terminal of the switch element 94, and the other terminal of the capacitor 95 are grounded. Thus, a direct-current power supply (DC) is taken out between both terminals of the capacitor 95.

Figure 8B:
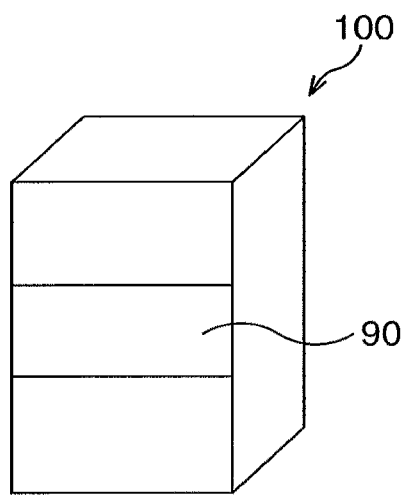

As illustrated in FIG. 8B, the PFC circuit 90 is installed in a server power supply 100 for use.

It is also possible to construct a power supply apparatus capable of high-speed operation similar to such a server power supply 100. Further, a switch element similar to the switch element 94 may be used in a switch power supply or electronic equipment. Furthermore, these semiconductor devices can also be used as parts for a full-bridge power supply circuit such as a power supply circuit of a server. Moreover, these semiconductor devices may also be used in electronic equipment for high frequency application such as a power amplifier. Further, these semiconductor devices may also be used as integrated circuits.

According to the above-described semiconductor device and so on, a gate of a transistor may be driven at a high speed to operate the transistor at a higher speed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has (have) been described in detail, it should be understood that the various changes, substitutions, and alterations could be made hereto without departing from the spirit and scope of the invention.

What is claimed is:
1. A semiconductor device, comprising:
a substrate;
a transistor comprising a gate electrode, an electron transit layer and an electron supply layer formed over the substrate;
an insulating film formed over the electron supply layer, the gate electrode comprising a portion over the insulating film;
a nitride semiconductor layer over the insulating film;
a first electrode and a second electrode formed over the nitride semiconductor layer, the gate electrode being located between the first electrode and the second electrode in planar view;
a first signal line formed over the nitride semiconductor layer between the first electrode and the gate electrode in planar view; and
a second signal line formed over the nitride semiconductor layer between the second electrode and the gate electrode in planar view.

2. The semiconductor device according to claim 1, further comprising an n-type GaN layer formed between the electron supply layer and the nitride semiconductor layer.

3. The semiconductor device according to claim 1, wherein an insulating layer that is the insulating film comprises at least one selected from the group consisting of an MN layer, an AlGaN layer, a p-type GaN layer, a Fe-doped GaN layer, a Si oxide layer, an Al oxide layer, a Si nitride layer, and a carbon layer.

4. The semiconductor device according to claim 1, further comprising a gate driver provided on the substrate and driving the first signal line and the second signal line.

5. The semiconductor device according to claim 1, wherein the nitride semiconductor layer comprises a second electron transit layer and a second electron supply layer stacked one on the other.

6. The semiconductor device according to claim 5, wherein the second electron transit layer comprises a GaN layer, and
the second electron supply layer comprises an AlGaN layer.

7. The semiconductor device according to claim 1, wherein
a portion of the nitride semiconductor layer between the gate electrode and the first electrode comprises a first region of a first conduction type, a second region of a second conduction type, and a third region of the first conduction type arranged in a direction of movement of the electric charges,
the first signal line is located on the second region,
a portion of the nitride semiconductor layer between the gate electrode and the second electrode comprises a fourth region of the second conduction type, a fifth region of the first conduction type, and a sixth region of the second conduction type arranged in a direction of movement of the electric charges, and
the second signal line is located on the fifth region.

8. A power supply apparatus, comprising
a semiconductor device which comprises:
a substrate;
a transistor comprising a gate electrode, an electron transit layer and an electron supply layer formed over the substrate;
an insulating film formed over the electron supply layer, the gate electrode comprising a portion over the insulating film;
a nitride semiconductor layer over the insulating film;
a first electrode and a second electrode formed over the nitride semiconductor layer, the gate electrode being located between the first electrode and the second electrode in planar view;
a first signal line formed over the nitride semiconductor layer between the first electrode and the gate electrode in planar view; and a second signal line formed over the nitride semiconductor layer between the second electrode and the gate electrode in planar view.

9. A method of manufacturing a semiconductor device, comprising:
   forming a transistor over a substrate, the transistor comprising a gate electrode, an electron transit layer and an electron supply layer;
   forming an insulating film over the electron supply layer, the gate electrode comprising a portion over the insulating film;
   forming a nitride semiconductor layer over the insulating film;
   forming a first electrode and a second electrode over the nitride semiconductor layer, the gate electrode being located between the first electrode and the second electrode in planar view;
   forming a first signal line over the nitride semiconductor layer between the first electrode and the gate electrode in planar view; and
   forming a second signal line over the nitride semiconductor layer between the second electrode and the gate electrode in planar view.

10. The method of manufacturing a semiconductor device according to claim 9, further comprising, between said forming the transistor and said forming the nitride semiconductor layer, forming an n-type GaN layer over the electron supply layer, wherein the nitride semiconductor layer is formed on the n-type GaN layer.

11. The method of manufacturing a semiconductor device according to claim 9, wherein said forming the nitride semiconductor layer comprises forming a second electron transit layer and a second electron supply layer stacked one on the other.

12. The method of manufacturing a semiconductor device according to claim 11, wherein
   a GaN layer is formed as the second electron transit layer, and
   an AlGaN layer is formed as the second electron supply layer.

* * * * *